United States Patent
Sato et al.

[11] Patent Number: 6,143,992
[45] Date of Patent: Nov. 7, 2000

[54] CIRCUIT BOARD WITH TERMINALS HAVING A SOLDER LEAD PORTION

[75] Inventors: Shingo Sato; Seigo Matsuzono; Kenshi Nakamura, all of Kokubu, Japan

[73] Assignee: Kyocera Corporation, Kyoto, Japan

[21] Appl. No.: 09/160,105

[22] Filed: Sep. 24, 1998

[30] Foreign Application Priority Data

Sep. 26, 1997 [JP] Japan ..................... 9-262404

[51] Int. Cl.[7] ............... H01R 12/04; H05K 1/11
[52] U.S. Cl. .................. 174/261; 361/767; 361/774
[58] Field of Search .................... 174/255, 260, 174/261; 361/760, 767, 774, 777; 257/690, 777

[56] References Cited

U.S. PATENT DOCUMENTS 5,394,011  2/1995  Yamamoto et al. .
5,784,262  7/1998  Sherman ................... 361/777

FOREIGN PATENT DOCUMENTS 5183067  7/1993  Japan .

Primary Examiner—Jeffrey Gaffin
Assistant Examiner—Jeremy Norris
Attorney, Agent, or Firm—Hogan & Hartson, LLP

[57] ABSTRACT

A circuit board of the invention comprises: an insulating base, which has a semiconductor element mounting portion on an top or bottom side thereof, and on which wiring patterns led out of the semiconductor element mounting portion are installed; and a plurality of substantially circular terminal pads, which are formed on the bottom side of the insulating base, which are connected to the wiring patterns, and to which solder terminals will be joined, wherein each of the terminal pads is provided with a solder lead portion which projects from a center side toward a perimeter side of the insulating base in a diametrical direction of the terminal pad. A part of the solder terminal is pulled out at the solder lead portion, whereby it is possible to prevent a fatigue failure of a joint of the terminal pad and the solder terminal due to a concentration of thermal stress, to electrically connect the solder terminal to the terminal pad in a stable manner for a long time period.

7 Claims, 2 Drawing Sheets

CIRCUIT BOARD WITH TERMINALS HAVING A SOLDER LEAD PORTION

BACKGROUND OF THE INVENTION

1. Field of the Invention

The present invention relates to a circuit board which is used as, for example, a board for packages for housing a semiconductor element, specifically, to a circuit board which has highly reliable terminal pads for connection with an external electric circuit board via nearly spherical terminals.

2. Description of the Related Art

Hitherto, as a board for packages for housing a semiconductor element such as an LSI (large-scale integrated circuit) has been used a circuit board made of an electrical insulating material such as alumina ceramics. Such a circuit board comprises an insulating base which has a mounting portion for mounting and housing one or more semiconductor elements at nearly the center of a top side thereof; a plurality of metallized wiring layers made of high melting point metal powder of tungsten, molybdenum or the like, which layers are led away from the periphery of the mounting portion toward a bottom side of the insulating base; a plurality of terminal pads which are formed on the bottom side of the insulating base, and to which the metallized wiring layers are electrically connected; and nearly spherical terminals which are made of solder or the like, and attached by brazing to the terminal pads. This circuit board and a lid for sealing the mounting portion form a package for housing a semiconductor element. Then, a semiconductor element is fixedly attached to the bottom of the mounting portion on the circuit board via an adhesive consisting of materials such as glass or resin so as to electrically connect each electrode of the semiconductor element to the metallized wiring layer via a bonding wire, and the lid is joined to the top side of the insulating base of the circuit board via a sealant of glass, resin or the like so as to hermetically seal the semiconductor element inside a package composed of the insulating base and the lid, whereby a semiconductor device is completed as a product.

Such a semiconductor device is implemented on an external electric circuit board by mounting the nearly spherical terminals made of solder or the like which are attached by brazing to the terminal pads on the bottom side of the insulating base, onto a wire conductor of the external electric circuit board which is formed by a resin insulating material and a copper wiring or the like so that the terminal pads are brought into contact with the wire conductor, and thereafter, heating and fusing the nearly spherical terminals at approximately 150–250° C. so as to join the terminals to the wire conductor. Simultaneously, each electrode of the semiconductor element housed inside the package for housing a semiconductor element is connected to an external electric circuit via the metallized wiring layer and the nearly spherical terminal.

The terminal pad on the bottom side of the insulating base of the circuit board forming such a semiconductor device, is shaped into a circle, a polygon with four or more angles, a shape in which a part of a polygon is arc, as disclosed in Japanese Unexamined Patent Publication JP-A 5-183067 (1993), in order to attach the terminal made of solder or the like as a nearly spherical protrusion to the terminal pad, whereby the terminal is formed as a nearly spherical protrusion owing to the surface tension of the solder to be attached.

However, in the case where such a conventional circuit board is connected to an external electric circuit board via nearly spherical terminals, a coefficient of thermal expansion of the insulating base made of alumina ceramics or the like is about $4 \times 10^{-6}$ to $7 \times 10^{-6}/°$ C., whereas the external electric circuit which is generally made of a resin insulation material such as a glass epoxy, has a large coefficient of thermal expansion of $1 \times 10^{-5}$ to $4 \times 10^{-5}/°$ C. There is a large difference in thermal expansion coefficient between them. Therefore, in the case where both of the insulating base of the circuit board and the external electric circuit board are subjected to repeated temperature cycles, which occur due to the semiconductor element which heats during operation and cools off to an ambient temperature when being halted, a large thermal stress is generated between the both due to a difference in thermal expansion coefficient. This thermal stress acts between the terminal pad and the nearly spherical terminal, brings a fatigue to a joint of them, and finally causes an separation and failure at the joint. As a result, the conventional circuit board has a problem that each electrode of a semiconductor element mounted on the circuit board cannot be electrically connected to a designated external electric circuit board for a long time period.

SUMMARY OF THE INVENTION

Hence such separation and failure caused at the joint of the terminal pad and nearly spherical terminal are analyzed in detail, and it is found that since the insulating base of the circuit board has a high strength, the base is not warped even when the thermal stress acts thereon, while, since the external electric circuit board is of low strength and elastic, the board is warped in accordance with thermal expansion, so that the nearly spherical terminals are subjected to thermal stresses of not only a direction along the circuit board, but also a direction perpendicular to the circuit board, and as a result, the thermal stresses concentrate on a specific part in the joint of the nearly spherical terminal and the terminal pad of the circuit board, which part is located on the perimeter side of the insulating base of the circuit board, that is, on the opposite side to the center side of the insulating base. Further, it is found that the nearly spherical terminals of the part is in contact with the terminal pads at the right angle or smaller, and hence a warp due to the thermal stress tends to concentrate on the part, with the result that cracking, separation and failure are caused at the part.

The present invention is made in view of the above problem and findings, and an object of the invention is to provide a circuit board in which each electrode of a semiconductor element to be mounted thereon can be electrically connected to a designated electric circuit board in a stable manner for a long time period, by preventing an occurrence of fatigue failure due to heat generation accompanying an actuation of the semiconductor element at the joint of the nearly spherical terminal and the terminal pad formed on a circuit board used for a package for housing a semiconductor element, a CSP (Chip Size Package), an interposer (junction board) and so on, by improving the shape of the terminal pad so as to disperse the stress due to the thermal expansion difference.

In one aspect of the present invention there is provided a circuit board comprising:
  an insulating base having a semiconductor element mounting portion on a top or bottom side thereof,
  a wiring pattern led out of the semiconductor element mounting portion being disposed on the insulating base; and
  a plurality of substantially circular terminal pads formed on the bottom side of the insulating base, the terminal pads for joining to solder terminals being connected to the wiring patterns, wherein each of the terminal pads is provided with a solder lead portion protruding from a center side toward a perimeter side of the insulating base.

According to the invention, the solder lead portion which protrudes from the center side toward the perimeter side of the insulating base, is disposed to each of the plurality of substantially circular terminal pads, which are formed on the bottom side of the insulating base, which are connected to the wiring patterns led out of the semiconductor element mounting portion, and to which the solder terminals will be joined. Therefore, the solder terminal will be pulled out of the substantially circular terminal pad by the solder lead portion to form a meniscus tail on the nearly spherical solder terminal, and the solder terminal comes into contact with the terminal pad at an angle larger than the right angle, that is, at a dull angle, so that it is possible to disperse distortion due to thermal stress, and to eliminate an occurrence of a crack, separation and failure resulting from that the thermal stress concentrates on the joint of the terminal pad and the solder terminal at the perimeter side of the insulating base. As a result, it is realized to produce a circuit board in which each electrode of a semiconductor element to be mounted can be electrically connected to a designated external electric circuit board via a solder terminal in a stable manner for a long time period.

In the invention it is preferable that a length of the solder lead portion is in a range of from a quarter to a double of a diameter of the terminal pad, and a width of the solder lead portion at a part which comes into contact with the terminal pad is in a range of from a tenth to a third of the diameter of the terminal pad.

In the case where the length of the solder lead portion is shorter than a quarter of the diameter of the substantially circular terminal pad, the amount of solder which flows from the solder terminal joined to the terminal pad into the solder lead portion, is not sufficiently much, so that it tends to become difficult to form a preferable meniscus tail and to force the solder terminal into contact with the terminal pad at a dull angle. On the other hand, in the case where the length of the solder lead portion is more than a double of the diameter of the terminal pad, it tends to become difficult to pull out the solder up to the tip end of the solder lead portion, and a short circuit easily occurs in the adjacent terminal, pads which are installed in high density, so that it tends to become difficult to install the terminal pads in high density. Therefore, it is preferred to select the length of the solder lead portion to be in the range of a quarter to a double of the diameter of the substantially circular terminal pad.

Further, in the case where the width of the solder lead portion at the part which is in contact with the terminal pad is narrower than a tenth of the diameter of the substantially circular terminal pad, it tends to become difficult to pull out a part of the solder terminal joined to the terminal pad, into the solder lead portion. On the other hand, in the case where this width is broader than a third of the diameter of the terminal pad, it tends to happen that the amount of the solder which flows into the solder lead portion is increased and the center position of the solder terminal joined to the terminal pad is largely deviated, so that it tends to happen that a position of the solder terminal is deviated with respect to a connection pad of the external electric circuit board and they cannot be properly connected with each other. Therefore, it is preferred that the width of the solder lead portion at the part which is in contact with the terminal pad is in the range of a tenth to a third of the diameter of the terminal pad.

In the invention it is preferable that the insulating base is made of aluminum oxide sintered body, aluminum nitride sintered body, silicon carbide sintered body, mullite sintered body or glass ceramics sintered body, and the terminal pad and the solder lead portion are made of high melting point metal.

The insulating base used in the invention is made of aluminum oxide sintered body, aluminum nitride sintered body, silicon carbide sintered body, mullite sintered body or glass ceramics sintered body. These sintered bodies are excellent in electric insulation and hence preferred.

Further, it is preferred that the terminal pad and the solder lead portion are made of a metal having a high melting point such as tungsten, molybdenum and manganese.

In the invention preferably nickel plating and gold plating are applied to the terminal pads and the solder lead portion. Thereby it is possible to prevent the surface of the high melting point metal from being oxidized and also to firmly join the surface of the high melting point metal to the solder terminal.

In the invention it is preferable that an insulating layer is adhered to the bottom side of the insulating base so that the terminal pads and the solder lead portions are exposed. Thereby the terminal pads are more firmly adhered to the insulating base.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
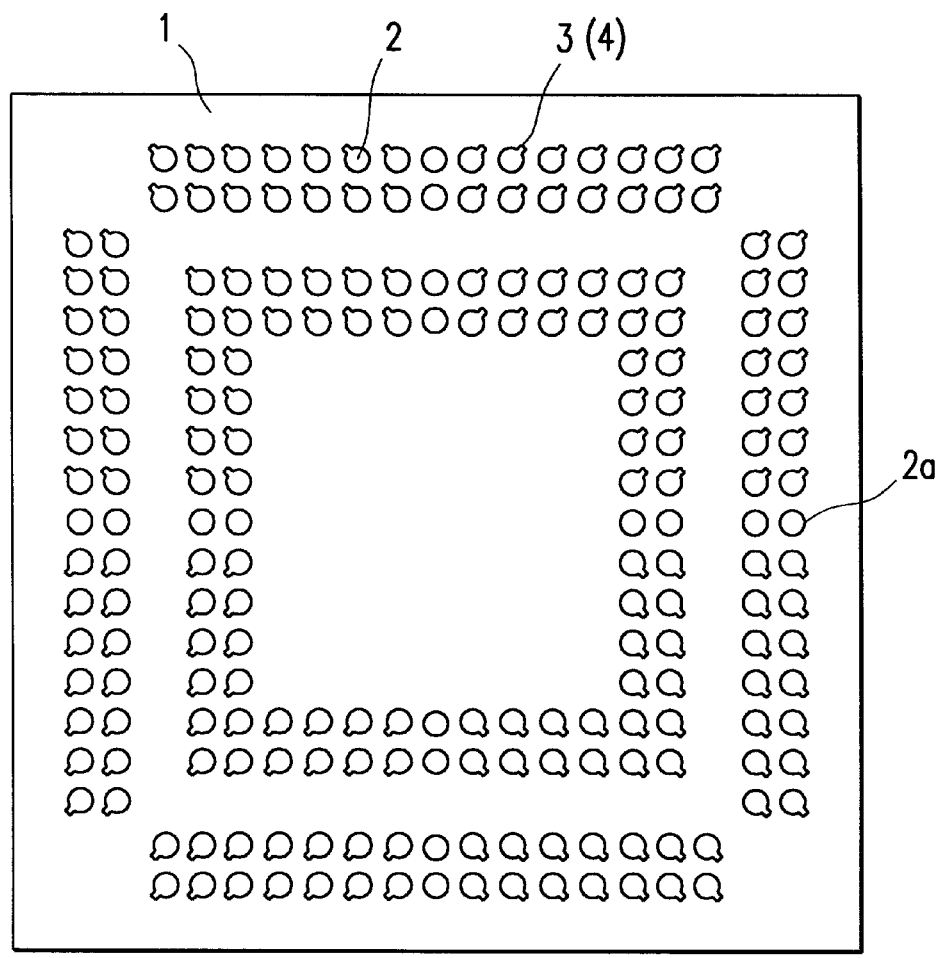
FIG. 1 is a plan view showing an embodiment of a circuit board according to the present invention.

Now referring to the drawings, preferred embodiments of the invention are described below.

FIG. 1 is a plan view of a circuit board according to the present invention, which is seen from a bottom side thereof. The circuit board comprises an insulating base 1 having a semiconductor element mounting portion, on which a wiring pattern led out of the semiconductor element mounting portion is disposed, and a plurality of substantially circular terminal pads 2 which are formed on a bottom side of the insulating base 1.

The insulating base 1 is made of an electrical insulating material having a small coefficient of thermal expansion such as ceramics, for example, aluminum oxide sintered body, aluminum nitride sintered body, silicon carbide sintered body, mullite sintered body or glass ceramics sintered body. For instance, in the case of the insulating base 1 made of aluminum oxide sintered body, the insulating base 1 is produced as follows. First, raw material powder such as aluminum oxide, silicon oxide, magnesium oxide, and calcium oxide is mixed with appropriate organic binder, plasticizer, solvent and the like which are added thereto so as to prepare slurry, which is made into green sheets (raw sheets) by the doctor blade method or the calender roll method, which green sheets thereafter are subjected to a proper punching process, subsequently laminated, and thereafter baked at a temperature of about 1600° C.

Further, the semiconductor element mounting portion (not shown) where a semiconductor element is mounted, is disposed on the top or bottom side of the insulating base 1, and the semiconductor element is adhered onto the semiconductor element mounting portion via an adhesive such as glass or resin, or via solder terminals, etc.

Furthermore, a plurality of wiring patterns (not shown) led out of the semiconductor element mounting portion are disposed on the insulating base 1. To one ends of the wiring patterns which portions are near the semiconductor element mounting portion are bonded electrodes of the mounted semiconductor element via bonding wires, solder terminals or the like, respectively, and the other ends thereof are led out to the bottom side of the insulating base 1 and connected to the plurality of terminal pads 2 formed on the bottom side of the insulating base 1, respectively.

Such a wiring pattern is formed by a metallized wiring layer, for example. The metallized wiring layer is made of metal having a high melting point such as tungsten, molybdenum and manganese. A metal paste obtained by mixing powder of the metal having a high melting point with appropriate organic binder, plasticizer, solvent and the like added thereto, is previously applied to the green sheets which becomes the insulating base 1, by printing in a designated pattern by utilizing the screen printing method or the like which is well-known, with the result that the metal paste is adhered on a designated position of the insulating base 1 in a predetermined pattern after baked.

Further similarly to the wiring pattern, the terminal pads 2 are made of high melting point metal such as tungsten, molybdenum, manganese or the like. A metal paste obtained by mixing powder of the high melting point metal with appropriate organic binder, plasticizer, solvent and the like added thereto is applied to the bottom side of the insulating base 1 by printing in a designated pattern so as to correspond to the led-out wiring patterns, and baked after the organic binder or solvent is evaporated to form the terminal pads in a substantially circular shape on the bottom side of the insulating base 1, which terminal pads are electrically connected to the wiring patterns.

Although shaping the terminal pad 2 into a substantial circle is preferable for obtaining a solder terminal of nearly spherical protrusion which is joined to the terminal pad 2, the terminal pad 2 may be shaped into a polygon with four or more angles, or a shape in which a part of the polygon is arc, etc.

Figure 2:
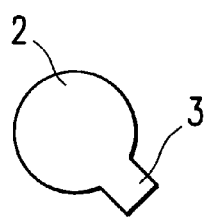
FIG. 2 is an enlarged plan view showing an embodiment of a terminal pad with a solder lead portion which is formed on the circuit board according to the invention.
Figure 3:
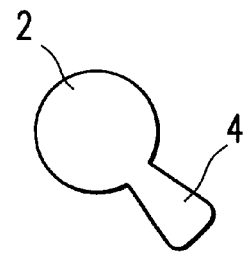
FIG. 3 is an enlarged plan view showing another embodiment of the terminal pad with the solder lead portion which is formed on the circuit board according to the invention.

FIGS. 2 and 3 are enlarged views showing the terminal pad 2. A solder lead portion 3 or 4 is provided in the terminal pad 2 so as to protrude from a center side toward a perimeter side of the insulating base 1 in a diametrical direction of the terminal pad. The solder lead portion 3 or 4, as well as the terminal pad 2, is made of high melting point metal such as tungsten, molybdenum and manganese.

The solder lead portion 3 or 4 may be shaped to have a uniform width as shown in FIG. 2, or may be shaped to be narrower at a point which is in contact with the terminal pad 2 and wider at the tip end thereof as shown in FIG. 3. The solder lead portion 3 or 4 may have any shape, as long as a part of the solder terminal can be led out from the terminal pad 2 by the solder lead portions 3 or 4.

Directions where the solder lead portions 3 or 4 protrudes at the respective terminal pads 2 may be set as necessary in consideration of a direction of the thermal stress, as long as they are directed from the center side toward the perimeter side of the insulating base 1. For instance, as shown in FIG. 1, in the case where the terminal pads 2 are arranged in a ring shape so as to form a substantially square shape with respect to the substantially square insulating base 1, the solder lead portions 3 or 4 are formed in divisions (quadrants) which are obtained by roughly dividing the square of the terminal pads into quarters, so as to direct to an angle of each division of the square. As a result, advantageously the solder lead portions 3 or 4 are located at a part where the thermal stress concentrates, of a joint of the solder terminal and the terminal pad 2.

The solder lead portions 3 or 4 may protrude in a radial direction from the center toward the perimeter of the insulating base 1. Further, the solder lead portions 3 or 4 may be selectively disposed to ones of the terminal pads 2 largely influenced by the thermal stress. In this case, with respect to terminal pads 2a which are located on a part less influenced by the thermal stress, for example, on center lines for dividing the bottom side of the square insulating base 1 into quarters, formation of the solder lead portions 3 or 4 may be omitted in view of an interval between the terminal pads 2. As described above, the protruding direction of the solder lead portions 3 or 4 can be set as necessary in accordance with an arrangement interval of the terminal pads 2 and a specification of the insulating base 1 and of the external electric circuit board.

The length of the solder lead portion 3 or 4 is set to be a quarter to a double of a diameter of the terminal pad 2 for the aforementioned reason, and the width thereof is set to be a tenth to a third of the diameter of the terminal pad 2. In the embodiment of FIG. 2, the length and width of the solder lead portion 3 are set to be approximately a third of the diameter of the terminal pad 2.

It is preferable to apply nickel plating of a thickness of 1–20 $\mu$m and gold plating of a thickness of 0.01–0.5 $\mu$m to the surface of the substantially circular terminal pad 2 and that of the solder lead portion 3 or 4 which are formed in the aforementioned manner, whereby it is possible to prevent the surface of the high melting point metal from being oxidized and also to firmly join the surface of the high melting point metal to the solder terminal.

The solder terminal is joined to the surface of the terminal pad 2 by blazing or the like, which solder terminal is almost circular and formed by lead-tin solder having a low melting point of which a lead-tin weight ratio is 37:63, for example. A part of the solder terminal is led out by the solder lead portion 3 or 4 to form a preferable meniscus tail. With this, the nearly circular solder terminal is firmly joined to the terminal pad 2 at a dull angle, at a part on a side where the solder lead portion 3 or 4 is located, that is, a part on the perimeter side of the insulating base 1. Even when, after the semiconductor element is mounted on the semiconductor element mounting portion of the insulating base 1 and the circuit board is implemented on the external electric circuit board, the heat generated during operation of the semiconductor element is repeatedly applied to both the insulating base 1 and the external electric circuit board, and then a large thermal stress due to the difference of the thermal expansion coefficients of the both is applied to the joint of the substantially circular terminal pad 2 and the solder terminal, the thermal stress can be effectively dispersed through the meniscus tail of the solder terminal formed by the solder lead portion 3 or 4. Therefore, cracking, separation and failure can be effectively prevented from occurring between the terminal pad 2 and the solder terminal.

Figure 4:
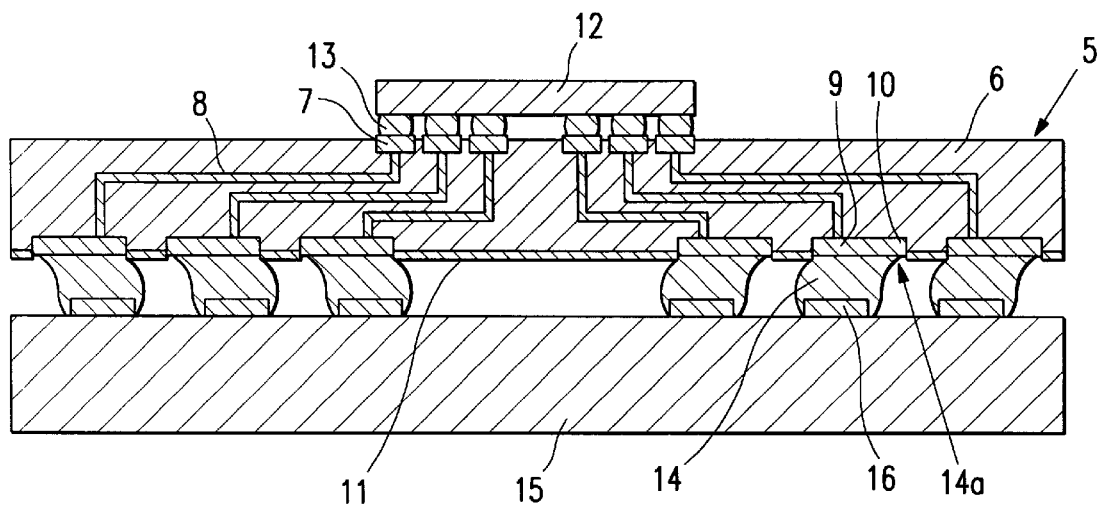
FIG. 4 is a sectional view showing a state in which an embodiment of the circuit board according to the invention is implemented.
Figure 5:
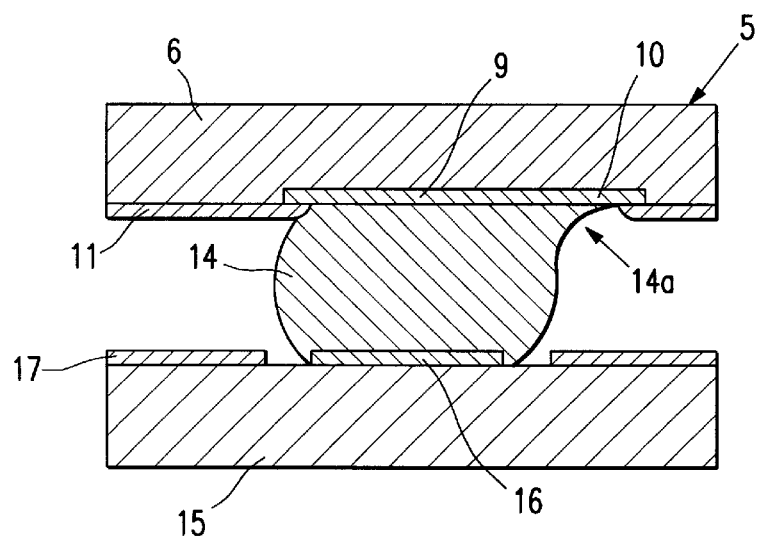
FIG. 5 is an enlarged sectional view showing a connecting portion in which an embodiment of the circuit board according to the invention is connected to an external electric circuit board.

FIG. 4 is a sectional view showing a state where a circuit board 5 of the invention, on which a semiconductor element 12 is mounted, is implemented on an external electric circuit board 15, and FIG. 5 is an enlarged sectional view showing a connecting portion of the circuit board 5 and the external electric circuit board 15. A lid (not shown) is attached onto the circuit board 5, whereby a semiconductor device in which the semiconductor element 12 is hermetically sealed can be realized.

The circuit board 5 of this embodiment comprises an insulating base 6, a top side of which is provided with a semiconductor element mounting portion having electrode pads 7 corresponding to electrodes of the semiconductor element 12, and which is provided with wiring patterns 8 connected to the electrode pads 7 and led out of the semiconductor element mounting portion; and a plurality of substantially circular terminal pads 9 which are formed on a bottom side of the insulating base 6, which are connected to the wiring patterns 8, and to which solder terminals 14 are joined, wherein the terminal pad 9 is provided with a solder lead portion 10 which protrudes from the center side toward the perimeter side of the insulating base 6. On the bottom side of the insulating base 6, an insulating layer 11 for adhering more firmly the terminal pads 9 to the insulating base 6 is formed, which insulating layer 11 is adhered by covering the almost whole of the bottom side while exposing the terminal pads 9 and the solder lead portions 10. The semiconductor element mounting portion may be formed on the bottom side of the insulating base 6.

The semiconductor element 12 is mounted on the semiconductor element mounting portion of the circuit board 5 via connecting terminals 13 made of solder or the like, so that the electrodes of the semiconductor element 12 are electrically connected to the electrode pads 7 of the circuit board 5.

Then, the circuit board 5 on which the semiconductor element 12 is mounted, is implemented on the external electric circuit board 15 via solder terminals 14, so that the terminal pads 9 of the circuit board 5 are electrically connected to the connecting pads 16 of the external electric circuit board 15 via the solder terminals 14. Accordingly, the electrodes of the semiconductor element 12 is electrically connected to wires of the external electric circuit board 15, respectively.

The terminal pad 9 of the circuit board 5 is provided with the solder lead portion 10 which protrudes from the center side toward the perimeter side of the insulating base 6 in a diametrical direction of the terminal pad 9. Therefore, as mentioned above, a part of the solder terminal 14 is led out to the solder lead portion 10 to form a meniscus tail 14a and to join the solder terminal 14 to the terminal pad 9 at a dull angle, and the heat stress which is repeatedly generated during operation of the semiconductor element 12 at the joint of the solder terminal 14 and the terminal pad 9, is effectively dispersed by the meniscus tail 14a. As a result, cracking, separation and failure will not be caused any more between the terminal pad 9 and the solder terminal 14, so that the respective electrodes of the semiconductor element 12 to be mounted can be electrically connected to the external electric circuit board 15 for a long time period stably.

As shown in FIG. 5, on a top side of the external electric circuit board 15 is formed an insulating layer 17 for preventing the solder from flowing out of the designated region, which insulating layer 17 is adhered by covering the almost whole of the top side while exposing the connecting pad 16.

As described above, according to the circuit board 5 of the invention, a semiconductor device as a product is fabricated in such a manner that the semiconductor element 12 is mounted on the semiconductor element mounting portion of the insulating base 6 via the connecting terminals 13, while electrically connecting the respective electrodes of the semiconductor element 12 to the wiring patterns 8 of the circuit board 5 via the connecting terminals 13, and thereafter, a lid is joined onto the top side of the insulating base 6 as necessary by utilizing a sealing member of glass, resin or the like to hermetically seal the semiconductor element 12 inside a package composed of the insulating base 6 and the lid, or a sealing material is applied to the top side of the insulating base 6 to hermetically seal the semiconductor element 12. The semiconductor device is implemented on the external electric circuit board 15 via the solder terminals 14 while the terminal pads 9 are electrically connected to the connecting pads 16, whereby the respective electrodes of the semiconductor element 12 are electrically connected to the external electric circuit board 15 for a long time period stably.

EXAMPLE

The present invention will be explained in greater detail with reference to the following example.

A circuit board of the invention was prepared as follows. A ceramics green sheet whose main raw material is alumina was subjected to processes of perforating, screen printing of metal paste and punching to prepare wiring patterns, while on a green sheet to be a bottom layer was printed patterns to be terminal pads and solder lead portions by utilizing metallized paste. The sheets were laminated and baked at a temperature of approximately 1600° C. Thus a circuit board of the invention was prepared in which 208 terminal pads are formed with a pitch of 0.5 mm in a square ring shape as shown in FIG. 1, on a bottom side of an insulating base which has outer dimensions of 11 mm square and 0.4 mm thickness, each of which terminal pads has a diameter of 0.3 mm and is provided with a solder lead portion which has a 0.08 mm width and a 0.2 mm length.

In this case, the solder lead portions are formed so as to protrude in a direction of 45° with respect to the center of the insulating base in each quadrant which is obtained by dividing the bottom side of the square insulating base into quarters as shown in FIG. 1.

Further, a conventional circuit board was also prepared as a comparative example in the same manner, wherein terminal pads which have a diameter of 0.3 mm and which are not provided with solder lead portions as shown in FIG. 1.

The respective circuit boards of the invention and of the comparative example were mounted on connecting pads having a diameter of 0.3 mm via spherical solder terminals having a diameter of 0.3 mm (lead: tin=37:63), which connecting pads of copper were formed on a top side of an external electric circuit board made of an FR4 board having a thickness of 1.6 mm so as to correspond to the terminal pads of the circuit board, and were passed through a reflow furnace (in the atmosphere, 220±10° C., approximately one minute at 200° C. or higher), whereby the terminal pads were joined to the solder terminals and the circuit board was implemented on the external electric circuit board via the solder terminals.

Then, 20 samples of the circuit board of the invention and 20 samples of the comparison example were subjected to a temperature cycle test in a range of −40° C. to +125° C., to count the number of circuit boards in which the joint of the terminal pad and the solder terminal is broken, for each 100 cycles, and conduct evaluation of the lives of junctions between the circuit boards and the external electric circuit board.

The results of the temperature cycle test are as follows.

| Temperature cycles: | Circuit boards broken (comparative example): | Circuit boards broken (example of the invention): |
|---|---|---|
| 300 | 0/20 | 0/20 |
| 400 | ↑ | ↑ |
| 500 | 6/20 | ↑ |
| 600 | 12/20 | ↑ |
| 700 | 19/20 | ↑ |
| 800 | 20/20 | ↑ |
| 900 | — | ↑ |
| 1000 | — | 2/20 |

As shown above, all of the circuit boards of the comparative example were broken at 800 cycles, whereas none of the circuit boards of the invention was broken at 800 cycles.

Further, with respect to the circuit boards of the invention, the number of cycles at which circuit boards were first observed broken is 1000 cycles, and hence it is proved that the junction life of the circuit board of the invention is more than twice as much as that of the conventional circuit board, on a temperature cycle basis.

As a result, it can be confirmed that, according to the circuit board of the invention, the junction between the terminal pad and the solder terminal has an extremely long life, and according to the circuit board of the invention, each electrode of the semiconductor element to be mounted can be electrically connected to a designated external electric circuit board for a long time period stably.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

For example, although lead-tin solder is used as solder of the solder terminal in the aforementioned example, it is needless to say that the solder may be, tin:silver= the residue: 0.5–10% by weight, tin:bismuth=the residue: 0.5–10% by weight, tin:silver:bismuth=the residue: 0.5–10% by weight: 0.5–10% by weight, and so on.

What is claimed is:

1. A circuit board comprising:

an insulating base, a plurality of substantially circular terminal pads formed on a surface of the insulating base, wherein each terminal pad is provided with a solder lead portion; and a plurality of substantially spherical solder terminals each joined to a terminal pad, wherein a part of the solder terminal is drawn into the solder lead portion of the terminal pad forming a meniscus tail.

2. The circuit board of claim 1, wherein a length of the solder lead portion is in a range of from a quarter to a double of a diameter of the terminal pad, and a width of the solder lead portion in contact with the terminal pad is in a range of from a tenth to a third of the diameter of the terminal pad.

3. The circuit board of claim 1 or 2, wherein the insulating base is made of aluminum oxide sintered body, aluminum nitride sintered body, silicon carbide sintered body, mullite sintered body or glass ceramics sintered body, and the terminal pad and the solder lead portion are made of high melting point metal.

4. The circuit board of claim 3, wherein nickel plating and gold plating are applied to the terminal pads and the solder lead portion.

5. The circuit board of claim 1 or 2, wherein an insulating layer is adhered to the bottom side of the insulating base around the terminal pads and the solder lead portions leaving them exposed.

6. A joint between two circuit boards, comprising:

a terminal pad formed on an insulating base of a first circuit board, wherein the terminal pad is provided with a solder lead portion protruding from a center side toward a perimeter side of the insulating base;

a connecting pad formed on an external circuit board coaxial to the terminal pad;

a substantially spherical solder joining the terminal and the connecting pads, wherein a part of the solder terminal is drawn into the solder lead portion of the terminal pad forming a meniscus tail.

7. A joint between two circuit boards according to claim 6, wherein the terminal pad has a substantially circular shape.

* * * * *